(12) United States Patent
Hofer

(10) Patent No.: US 7,268,711 B1
(45) Date of Patent: Sep. 11, 2007

(54) METHOD AND CIRCUIT FOR AMPLITUDE COMPENSATION IN A DIGITAL-TO-ANALOG CONVERTER

(75) Inventor: Bruce E. Hofer, Portland, OR (US)

(73) Assignee: Audio Precision, Inc., Beaverton, OR (US)

( * ) Notice: Subject to any disclaimer, the term of this patent is extended or adjusted under 35 U.S.C. 154(b) by 0 days.

(21) Appl. No.: 11/388,594

(22) Filed: Mar. 24, 2006

(51) Int. Cl.
*H03M 1/06* (2006.01)

(52) U.S. Cl. .................... 341/118; 341/144

(58) Field of Classification Search .......... 341/144, 341/143, 120, 118, 135
See application file for complete search history.

(56) References Cited

U.S. PATENT DOCUMENTS

| | | | |
|---|---|---|---|
| 4,583,118 A * | 4/1986 | Mallinson et al. | 348/548 |
| 4,682,086 A * | 7/1987 | Mallinson et al. | 315/371 |
| 4,879,505 A | 11/1989 | Barrow et al. | 323/312 |
| 5,055,847 A * | 10/1991 | Rybicki et al. | 341/162 |
| 5,287,063 A | 2/1994 | Izawa | 324/601 |
| 5,886,657 A | 3/1999 | Ahuja | 341/144 |
| 6,075,354 A | 6/2000 | Smith et al. | 323/313 |
| 6,940,440 B1 | 9/2005 | Iacob | 341/144 |
| 2005/0073290 A1 | 4/2005 | Marinca et al. | 323/313 |

FOREIGN PATENT DOCUMENTS

| | | |
|---|---|---|
| JP | 55-156422 | 5/1979 |
| JP | 56166628 A | 12/1981 |

* cited by examiner

*Primary Examiner*—Peguy JeanPierre
(74) *Attorney, Agent, or Firm*—Birdwell & Janke, LLP

(57) ABSTRACT

An amplitude-compensated digital-to-analog converter circuit and method of compensation. A unipolar digital-to-analog converter is provided, having a reference connection and a pair of differential, unipolar signal outputs. A sensing circuit senses the common mode component of the differential outputs and produces a common mode signal. A reference source produces a first reference signal, and a differential control amplifier compares the common mode signal to the first reference signal and applies a second reference signal applied to the reference connection of the digital-to-analog converter, thereby stabilizing the reference current for the digital-to-analog converter. The circuit includes a single signal output reference to ground and a multiple-pole low-pass filter.

19 Claims, 2 Drawing Sheets

METHOD AND CIRCUIT FOR AMPLITUDE COMPENSATION IN A DIGITAL-TO-ANALOG CONVERTER

BACKGROUND OF THE INVENTION

1. Field of the Invention

This invention relates to digital-to analog converter circuits, and particularly to circuits that provide a more stable reference signal for a digital-to-analog converter.

2. Description of the Related Art

Accurate, stable and high resolution digital-to-analog converters ("DAC") are needed for many applications. One application for which they are needed is audio system testing. In particular, they are needed for digital-to-analog converter circuits that are central to an audio signal generator for producing a test signal to be applied to the input of an audio system under test. Since many audio system tests involve comparing the output signal of the audio system to a signal applied to the input of the audio system to determine such characteristics as the linear transfer function, harmonic distortion and intermodulation distortion, the accuracy with which such characteristics can be determined depends on the stability of the input signal.

High resolution and performance integrated circuit ("IC") DACs with differential current outputs often include an on-chip voltage reference device that is used in conjunction with an external resistor to produce a reference current and thereby set the magnitude of the output currents in response to a given digital input signal. However, for many applications, including but not limited to precision audio testing, the internal voltage reference device is not as stable as is needed. Changes in the operating temperature of the DAC due, for example, to warm up, changes in ambient temperature, and varying heat dissipation caused by varying the sample rate will cause errors in the amplitude of the output signal current.

One approach to this problem is to try to design more stable voltage sources within the DAC itself, but system manufacturers are dependent on IC manufacturers to do so. Accordingly, it would be desirable to provide a digital-to-analog circuit with the stability needed for a particular application that is not dependent on the inherent stability of a component DAC IC.

BRIEF SUMMARY OF THE INVENTION

The present invention provides an amplitude-compensated digital-to-analog converter circuit and method of compensation. It includes a unipolar digital-to-analog converter having a reference connection and a pair of differential, unipolar signal outputs. A sensing circuit senses the common mode component of the differential outputs and produces a common mode signal. A reference source produces a first reference signal, and a differential control amplifier compares the common mode signal to the first reference signal and applies a second reference signal applied to the reference connection of the digital-to-analog converter, thereby stabilizing the reference voltage for the digital-to-analog converter.

The circuit architecture also lends itself to the inclusion of a single signal output referenced to ground and a multiple-pole low-pass filter.

It is to be understood that this summary is provided as a means for generally determining what follows in the drawings and detailed description, and is not intended to limit the scope of the invention. Objects, features and advantages of the invention will be readily understood upon consideration of the following detailed description taken in conjunction with the accompanying drawings.

DETAILED DESCRIPTION OF ILLUSTRATIVE EMBODIMENTS

In the following description many details are set forth to provide an understanding of the disclosed embodiments of the invention. However, upon reviewing this disclosure, it will become apparent to one skilled in the art that not all of the disclosed details may be required to practice the claimed invention and that alternative embodiments might be constructed without departing from the principles of the invention.

Figure 1:
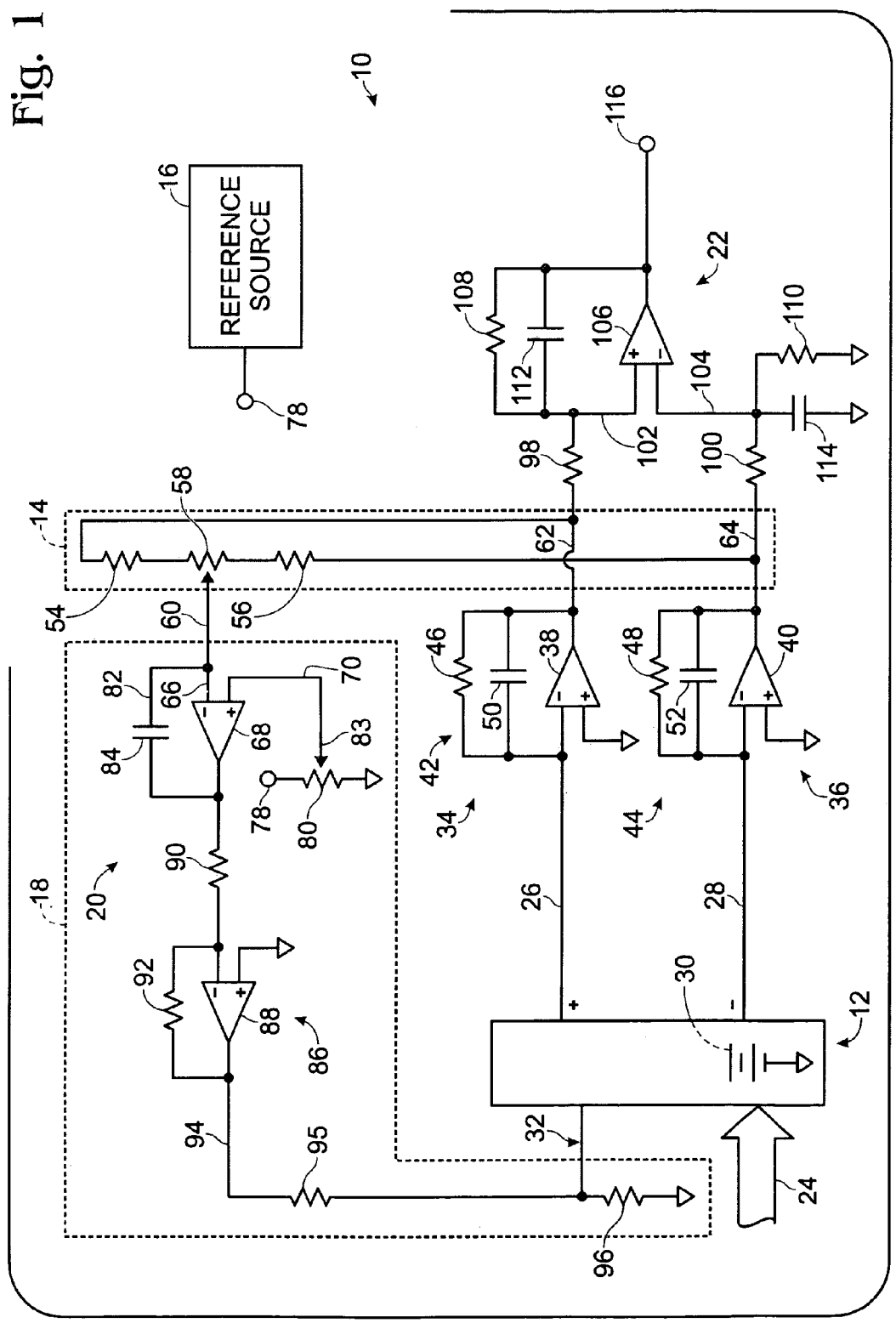
FIG. 1 is a schematic diagram of an amplitude compensated digital-to-analog converter circuit according to a specific embodiment of the present invention.

Referring first to FIG. 1, a specific embodiment of a digital-to-analog circuit 10 according to the present invention comprises a DAC 12, a sensing circuit 14, an independent reference source 16, and a DAC feedback control loop 18, having a differential control amplifier 20. It also includes a differential-to-single signal output amplifier 22 for providing an output signal referenced to ground, though it is to be understood that this output amplifier could be left out so as to provide a differential output without departing from the principles of the invention.

The DAC 12 is a high resolution and performance IC having a digital input 24, a non-inverting differential signal output 26 and a corresponding inverting differential output 28, the differential outputs being unipolar so that, while their respective ac signal components are inverted with respect to one another, they each have a common mode dc component. In this specific embodiment, the DAC outputs 26 and 28 are shown as current sources, but it is to be understood that a DAC with voltage source differential outputs could be employed without departing from the principles of the invention. The DAC also includes an internal voltage reference source 30 and a reference connection 32. Ordinarily, a resistor would be connected between the reference connection 32 and ground to set the reference current within the DAC.

Figure 2A:
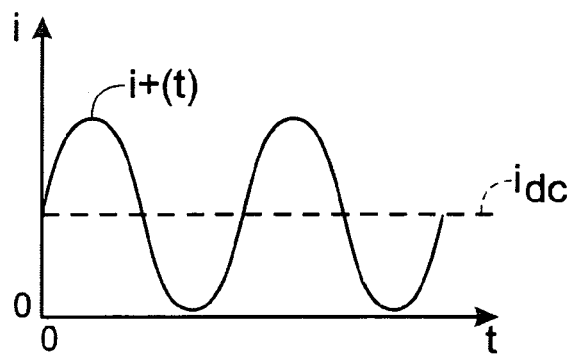
FIG. 2A shows an example of a typical signal produced at a first, non-inverting output of a digital-to-analog converter in the circuit of FIG. 1.
Figure 2B:
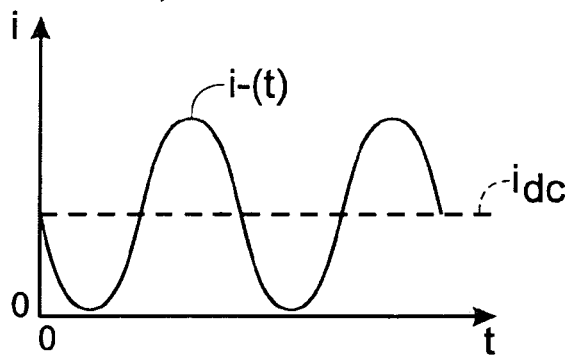
FIG. 2B shows the signal produced at a second, inverting output of the digital-to-analog converter in the circuit of FIG. 1 that is complementary to the signal shown in FIG. 2A.

FIG. 2A shows a plot with respect to time of a typical signal produced at the non-inverting output 26 of the DAC in response to a sinusoidal digital input. The ac component is indicated by $i_+(t)$ and the dc component is indicated by $i_{dc}$. Similarly, FIG. 2B shows a plot of the signal produced at the inverting output 28 of the DAC with respect to time. The ac component is indicated by $i_-(t)$ and the dc component is again indicated by $i_{dc}$ as the dc component is common to both outputs, that is, it is a common mode component. As the outputs are unipolar, the plots are always positive with respect to zero, though it would make no material difference to the invention to show them as always negative with respect to zero.

Returning to FIG. 1, the outputs 26 and 28 of the DAC are applied to inputs of respective differential transimpedance amplifiers 34 and 36. As will be understood by a person of skill in the art, the transimpedance amplifiers convert input current from the DAC to output voltage. These transimpedance amplifiers comprise respective operational amplifiers 38 and 40, having respective feedback loops 42 and 44 with appropriate impedances, as will also be understood by a person of skill in the art. In this specific embodiment the impedances have a resistive component represented by respective resistors 46 and 48, and capacitive component represented by respective parallel capacitors 50 and 52, the purpose of which will be explained below.

Figure 2C:
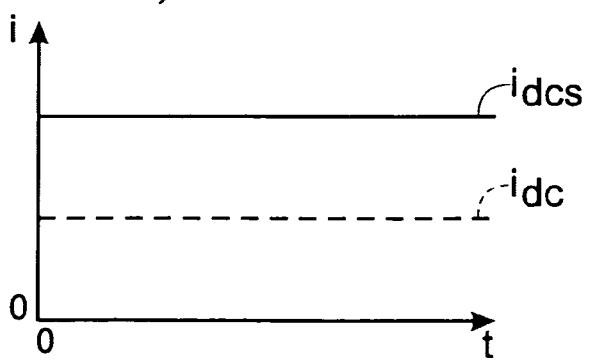
FIG. 2C shows the result of adding the signal of FIG. 2A and the signal of FIG. 2B.

The sensing circuit 14 in this specific embodiment is a resistor network that works as a voltage divider and current summing circuit. The network comprises two substantially identical fixed resistors 54 and 56, and a variable resistor 58 having an adjustable tap 60. The three resistors are connected in series, with the variable resistor disposed between the two fixed resistors and the opposite ends of the series network being connected respectively to the outputs 62 and 64 of the transimpedance amplifiers 34 and 36. As will be appreciated by a person of skill in the art, the ac components of the differential signal appearing at the respective outputs of the transimpedance amplifiers will cancel one another when the tap is properly adjusted. However, the tap is applied to the inverting input 66 of a differential operational amplifier 68, so that the voltage applied to input 66 is equal to the common mode dc signal voltage produced at outputs 62 and 64 of transimpedance amplifiers 34 and 36, and currents from the common mode dc signals add. The current addition is indicated in FIG. 2C by $i_{dcs}$.

Figure 3:
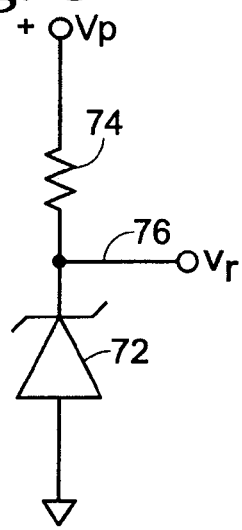
FIG. 3 is a schematic diagram of an example of reference source for use in the circuit of FIG. 1.

The operational amplifier 68 is part of the differential control amplifier 20, as will be explained in more detail below. The non-inverting input 70 of the operational amplifier 20 receives a signal from the reference source 16. An example of a voltage reference source is shown in FIG. 3. It comprises a zener diode 72 in series with a resistor 74, the series pair being connected between a power supply voltage VP and ground. As a person of skill in the art will appreciate, a stable fixed reference voltage will be produced by this circuit at connection 76.

In practice, the reference source is preferably a more sophisticated commercial component that provides a precision reference voltage that has a low temperature coefficient and may be independently temperature controlled for stability. Such devices are commonly available, as will be appreciated by a person of skill in the art. One example of a suitable precision reference voltage device with a low temperature coefficient is a MAX6126 ultra-high-precision, ultra-low-noise, series voltage reference available from Maxim Integrated Products, of Sunnyvale, Calif. However, any convenient voltage or current reference that provides the desired stability could be used without departing from the principles of the invention. The output of the voltage reference 78 is applied to one end of a variable resistor 80 whose other end is connected to ground. The tap 83 of the variable resistor is connected to input 70 of the operational amplifier 68, as mentioned above. Consequently, the variable resistor 80 can be used to adjust the reference voltage applied to input 70 of the operational amplifier 68.

Returning again to FIG. 1, the control amplifier comprises the operational amplifier 68 and a feedback loop 82, and effectively uses the resistors 54, 56 and 58 of the sensing circuit 14, and the variable resistor 80, as input resistors from the sensing circuit and reference source, respectively. The feed back loop preferably has a capacitive reactance, represented by capacitor 84, so that the control amplifier acts as an integrator. This serves to drive the difference between the two input voltages, that is, the reference voltage and the dc common mode voltage, to zero and thereby simplifies the design of the feedback control loop 18. However, a non-integrating control amplifier could be used without departing from the principles of the invention.

In this specific embodiment, the output of the control amplifier 20 is applied to an inverting amplifier 86, comprising an operational amplifier 88, an input resistor 90, a feedback resistor 92, and an output 94, as will be understood by a person of skill in the art. However, this is described for the sake of completeness, and it is to be understood that a different circuit design could be used that would not need the inverting amplifier without departing from the principles of the invention.

The output 94 of the inverting amplifier 86 is applied through a feedback resistor 95 to the reference connection 32 of the DAC and a reference resistor 96 is connected from that input to ground, as mentioned above. The current through the feedback resistor 95 from the DAC feedback control loop 18 adjusts the DAC reference current so that the common mode voltage applied to input 66 of control amplifier 20 matches the reference voltage from the reference source 16, as adjusted with the variable resistor 80, thereby providing the desired reference current stability for the digital-to-analog converter circuit 10.

In addition to the foregoing, which provides the amplitude compensation of the invention, the digital-to-analog converter circuit may include the differential-to-single signal output amplifier 22. As will be understood by a person of skill in the art, the two differential outputs 62 and 64 from the transimpedance amplifiers 34 and 36, respectively, are applied through respective input resistors 98 and 100 to the non-inverting input 102 and the inverting input 104 of operation amplifier 106. Each of the inputs has a feedback loop comprising resistors 108 and 110, and capacitors 112 and 114, respectively, so that a single signal referenced to ground is produced at the output 116 of the digital-to-analog converter circuit 10.

It will be appreciated that the capacitors 50 and 52 of the respective transimpedance amplifiers 38 and 40, and the capacitors 112 and 114 of the differential-to-single signal output amplifier 22, introduce a multi-pole low-pass filter. While the filter is not necessary for the operation of the digital-to-analog converter circuit, and these capacitors could be eliminated without affecting the reference stability or the provision of a single-signal output, they provide an added advantage that is made convenient by the overall circuit architecture. It will be appreciated that, while a two-pole filter is shown, additional amplifier stages could be added to produce a filter having additional poles.

Preferably, the DAC 12 is physically isolated from the reference source 16 so that heat from the DAC does not affect the reference source. Also, while the reference source may rely on a low temperature coefficient to maintain stability, it may also, or alternatively, include a temperature control device such as a cooling thermocouple. As an additional alternative, the reference source may be provided with an external temperature control device, such as a cooling thermocouple and control circuit.

It will be appreciated by a person of skill in the art that the foregoing not only describes a specific digital-to-analog converter circuit, but also a method for compensating a digital-to-analog converter circuit for changes in a reference value, particularly variations in the internal reference voltage of the a digital-to-analog converter IC due to changes in operating temperature.

The terms and expressions that have been employed in the foregoing specification are used therein as terms of description and not of limitation, and there is no intention, in the uses of such terms and expressions, to exclude equivalents of the features shown and described or portions thereof, it being recognized that the scope of the invention is defined and limited only by the claims which follow.

What is claimed is:

1. An amplitude-compensated digital-to-analog converter circuit, comprising:
    a unipolar digital-to-analog converter, having a reference connection and a pair of differential, unipolar signal outputs that have a common mode component;
    a sensing circuit for sensing the common mode component of the differential outputs and producing a common mode signal;
    a reference source for producing a first reference signal; and
    a differential control amplifier, having a first control amplifier input, a second control amplifier input and a control amplifier output, the first reference signal being applied to the first control amplifier input, the common mode signal being applied to the second control amplifier input, and the control amplifier output producing a second reference signal applied to the reference connection of the digital-to-analog converter.

2. The circuit of claim 1, further comprising a feedback loop from the control amplifier output to one of the first control amplifier input or the second control amplifier input so as to provide an inverted feedback signal.

3. The circuit of claim 2, wherein the feedback loop includes capacitive reactance so that the control amplifier operates as an integrator.

4. The circuit of claim 1, wherein the sensing circuit comprises a summing circuit for summing respective signals produced by the differential outputs of the digital-to-analog converter.

5. The circuit of claim 1, further comprising a first transimpedance amplifier having an input and an output, and a second transimpedance amplifier having an input and an output, one of the differential outputs of the digital-to-analog converter being applied to the input of the first transimpedance amplifier and the other of the differential outputs of the digital-to-analog amplifier being applied to the input of the second transimpedance amplifier, the sensing circuit comprising a summing circuit for summing the output of the first transimpedance amplifier and the output of the second transimpedance amplifier.

6. The circuit of claim 5, wherein the first reference signal is a voltage reference.

7. The circuit of claim 5, wherein the summing circuit comprises a voltage divider connected between the output of the first transimpedance amplifier and the output of the second transimpedance amplifier, the common mode signal being produced by a tap on the voltage divider.

8. The circuit of claim 7, wherein the tap is adjustable to cancel out the ac components of the outputs of the first and second transimpedance amplifiers.

9. The circuit of claim 1, wherein the reference source is a temperature controlled device.

10. The circuit of claim 1, wherein the reference source includes a device for adjusting the magnitude of the first reference signal.

11. The circuit of claim 10, further comprising a first pole filtering feedback loop from the output of the first transimpedance amplifier to the input thereof, a first pole filtering feedback loop from the output of the second transimpedance amplifier to the input thereof, and a second pole filtering feedback loop from the output of the differential-to-single signal amplifier to an input thereof, thereby producing a multi-pole low pass filter.

12. The circuit of claim 1, further comprising a differential-to-single signal amplifier having a first differential-to-single input, a second differential-to-single signal input and a differential-to-single signal output, the output of the first transimpedance amplifier being applied to the first differential-to-single signal input, and the output of the second transimpedance amplifier being applied to the second differential-to-single signal input, the differential-to-single signal amplifier producing a single output signal based on a digital signal applied to the digital-to-analog converter.

13. A method for compensating a digital-to-analog converter circuit for changes in a reference value, comprising:
    providing the digital-to-analog converter circuit with a unipolar digital-to-analog converter, having a reference connection and a pair of differential, unipolar signal outputs that have a common mode component;
    sensing the common mode component of the differential outputs and producing a common mode signal;
    producing a first reference signal;
    comparing the common mode signal to the first reference signal to produce a second reference signal; and
    applying the second reference signal to the reference input of the digital-to-analog converter.

14. The method of claim 13, further comprising integrating the difference in amplitude between the first reference signal and the common mode signal to produce the second reference signal.

15. The method of claim 13, wherein producing a first reference signal includes providing reference source at least a portion of whose temperature is controlled independently of the temperature of the unipolar digital-to-analog converter.

16. The method of claim 13, wherein producing a reference signal comprises producing a voltage reference signal.

17. The method of claim 13, wherein the comparing comprises converting the differential outputs of the unipolar digital-to-analog converter from currents to respective voltages, and determining the difference of those respective voltages to produce the common mode signal.

18. The method of claim 17, further comprising converting the respective differential signal voltages to a single voltage.

19. The method of claim 13, further comprising low-pass filtering the differential outputs of unipolar digital-to-analog converter.

* * * * *